United States Patent
Hembacher

(10) Patent No.: US 9,696,518 B2
(45) Date of Patent: Jul. 4, 2017

(54) POSITION MANIPULATOR FOR AN OPTICAL COMPONENT

(71) Applicant: Carl Zeiss SMT GmbH, Oberkochen (DE)

(72) Inventor: Stefan Hembacher, Bobingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 766 days.

(21) Appl. No.: 13/764,573

(22) Filed: Feb. 11, 2013

(65) Prior Publication Data

US 2013/0242282 A1    Sep. 19, 2013

Related U.S. Application Data

(60) Provisional application No. 61/598,400, filed on Feb. 14, 2012.

(30) Foreign Application Priority Data

Feb. 14, 2012   (DE) .................. 10 2012 202 170

(51) Int. Cl.
  *G02B 7/182* (2006.01)
  *G03F 7/20* (2006.01)
  *G02B 7/22* (2006.01)

(52) U.S. Cl.
  CPC ............. *G02B 7/1828* (2013.01); *G02B 7/22* (2013.01); *G03F 7/709* (2013.01); *G03F 7/7015* (2013.01); *G03F 7/70141* (2013.01); *G03F 7/70825* (2013.01)

(58) Field of Classification Search
  CPC ... G03F 7/70825; G03F 7/709; G02B 7/1828; G02B 7/22
  See application file for complete search history.

(56) References Cited

U.S. PATENT DOCUMENTS

| | | | |
|---|---|---|---|
| 6,402,329 B1 | 6/2002 | Bailly et al. | |
| 7,692,884 B2 * | 4/2010 | Ishikawa | G02B 7/1827 359/811 |
| 2002/0089766 A1 * | 7/2002 | Moeller | G02B 7/023 359/811 |

(Continued)

FOREIGN PATENT DOCUMENTS

| | | |
|---|---|---|
| DE | 4431405 | 3/1996 |
| DE | 10344178 | 4/2005 |

(Continued)

OTHER PUBLICATIONS

"Thermal Expansion Anomalies at Spin-Reorientation in SmFe2: The Role of the Magnetic Texture" S.M. Podgornykh et al, Textures and Microstructures, vol. 32, pp. 303-308.*

(Continued)

*Primary Examiner* — Michelle M Iacoletti
(74) *Attorney, Agent, or Firm* — Fish & Richardson P.C.

(57) ABSTRACT

A device for adjustably positioning an optical component includes a holding unit, which is which at least partly composed of a magnetostrictive material, and a mechanism for generating a magnetic field having a predetermined directional and amplitude distribution in the region of the holding unit. The holding unit has, in a predefined direction, an expansion which can be varied by a specific absolute value by the effect of the magnetic field.

21 Claims, 3 Drawing Sheets

(56) References Cited

U.S. PATENT DOCUMENTS

| | | | |
|---|---|---|---|
| 2003/0168295 A1* | 9/2003 | Han et al. .................. | 188/267.1 |
| 2006/0007563 A1 | 1/2006 | Weber et al. | |
| 2008/0218721 A1* | 9/2008 | Schoeppach et al. .......... | 355/67 |
| 2008/0278704 A1 | 11/2008 | Endres et al. | |
| 2009/0065664 A1* | 3/2009 | Kock et al. ................... | 248/157 |
| 2009/0147229 A1* | 6/2009 | Schaffer .............. | G03F 7/70825 |
| | | | 355/67 |

FOREIGN PATENT DOCUMENTS

| | | |
|---|---|---|
| DE | 102009009568 | 4/2010 |
| EP | 1884831 | 2/2008 |

OTHER PUBLICATIONS

German Examination Report, with English translation, issued in DE 10 2012 202 170.1 on Jan. 25, 2013.

\* cited by examiner

POSITION MANIPULATOR FOR AN OPTICAL COMPONENT

CROSS-REFERENCE TO RELATED APPLICATIONS

This application claims priority under 35 U.S.C. §119(e) to U.S. Provisional Patent Application Ser. No. 61/598,400, filed Feb. 14, 2012, and this application claims priority under 35 U.S.C. benefit under 35 U.S.C. §119 of German patent application DE 10 2012 202 170.1, filed Feb. 14, 2012, the entire contents of each are incorporated herein by reference.

FIELD

The disclosure relates to a device for the adjustable positioning of a component, to an optical assembly including such a device, and to a method for the adjustable positioning of a component. Further, the disclosure relates to an optical unit for a projection exposure apparatus, to an illumination system for a projection exposure apparatus, and to a projection exposure apparatus. In addition, the disclosure relates to a method for producing a microstructured component, and to a component produced according to the method.

BACKGROUND

A projection exposure apparatus for microlithography is known from EP 1 884 831 A2, for example.

To achieve the desired accuracies in such a projection exposure apparatus, it is generally desirable to arrange the optical components very precisely. There is generally a constant desire for improvement in this regard.

SUMMARY

The disclosure provides a device for the adjustable positioning of a component, such as an optical component.

In one aspect, the disclosure provides a device for adjustably positioning of a component. The device includes a holding unit for mounting the component, and a mechanism for generating a magnetic field having a predetermined directional and amplitude distribution in the region of the holding unit. The holding unit includes at least one holding strut composed of a magnetostrictive material. The holding struts are arranged on a carrier and mechanically connected thereto. The holding struts are connected to the component in each case at their opposite end relative to the carrier. The holding struts have an extension in a longitudinal direction which can be varied by a specific absolute value by the effect of the magnetic field.

The disclosure involves using a magnetostrictive actuator for the adjustable positioning of a component. According to the disclosure, a holding unit is provided for mounting a component. The holding unit is at least partly composed of a magnetostrictive material. A mechanism is provided for generating a magnetic field has a predetermined direction and amplitude. By generating a suitable magnetic field, it is possible to achieve a change in length of the magnetostrictive material of the holding unit, which leads to a displacement of the optical component. With a suitable magnetic field, it is possible to achieve very precise changes in length of from a few picometers to micrometers. The relative change in length that can be achieved via the magnetic field is in the range of up to 10-4. Because the adjustable positioning according to the disclosure is based on the elongation of a solid, a particularly high mechanical stiffness of the holding unit can be obtained. The stiffness can be, for example, at least 104 N/mm. This should be understood to mean that a force of at least 104 N is used for a change in length of 1 mm.

The component can be, for example, an optical component, such as a mirror (e.g., a mirror for an EUV projection exposure apparatus). Other components, such as a reticle holder or a wafer holder, can also be positioned very precisely via the device according to the disclosure.

The magnetic field for displacing the optical component can be generated in a simple manner via one or more coils. In this case, the coils are preferably each arranged around one of the holding struts of the holding unit. The holding unit can have, for example, a plurality of bipods, such as three bipods. The limbs of the bipods are in each case surrounded by a coil. The magnetic field which can be generated via the respective coil is preferably oriented in each case parallel to the orientation of a limb of the bipods.

Preferably, the individual coils are controllable independently of one another. The optical component is therefore very flexibly displaceable, such as in the direction of its optical axis and/or tiltable about an axis transversely (e.g., perpendicularly) with respect to its optical axis.

In principle, it is also conceivable for the holding unit to be have a multiplicity of holding struts connected to the optical component. The form of the optical component can be modifiable via the change in length of the struts.

The coils for generating the magnetic field can advantageously be arranged in a contact-free fashion with respect to the holding struts. They can advantageously also be arranged in a contact-free fashion with respect to the optical component to be displaced. They are arranged, for example, in a manner mechanically decoupled from the optical component. They are preferably arranged so that the magnetic field generated by them is oriented in each case at least in sections parallel to a holding strut of the holding unit. Such an orientation leads to a particularly advantageous, in particular efficient, magnetic field/change in length characteristic.

The holding unit includes at least one holding strut, such as a plurality of holding struts. The holding struts are embodied in a rod-shaped fashion. They have a length in the range of 1 cm to 1 m, such as in the range of 2 cm to 60 cm.

They can have, for example, a round or polygonal, for example square or hexagonal, cross section. The holding unit preferably includes a multiplicity of holding struts. The holding struts can advantageously be connected to the optical component in each case in pairs, i.e. in the form of bipods. For example, three bipods can be provided. The latter are advantageously arranged in an equilateral triangle. This enables the optical component to be tilted very flexibly.

The holding struts are preferably mechanically decoupled from the optical component via a decoupling element. The decoupling element can be a circumferential constriction or cutout in the holding struts. Such a decoupling element can be produced particularly simply. In this case, it is possible, for example, to provide two constrictions on each holding strut. The constrictions are rotated relative to one another with respect to the longitudinal axis of a holding strut (e.g., rotated relative to one another by 90°). This results in a decoupling in two directions rotated relative to one another, such as running perpendicularly to one another, in the manner of a cardan joint.

In another aspect, the disclosure provides an optical assembly which includes an optical component and a device according to the disclosure for the adjustable positioning of the optical component.

The advantages correspond to those described above.

The optical component is, for example, a mirror, such as a mirror for a projection exposure apparatus (e.g., for an EUV projection exposure apparatus). Therefore, the mirror is, for example reflective for electromagnetic radiation in the EUV range.

Other optical components can likewise be displaced precisely via the positioning device according to the disclosure.

In a further aspect, the disclosure provides a method for the adjustable positioning of an optical component. The method includes providing a component and providing a device according to the disclosure for the positioning of the component. The method also includes generating a magnetic field having a predefined directional and amplitude distribution in the region of the holding unit.

The disclosure makes it possible, by using a magnetostrictive material in at least one part of the holding unit of an optical component, to displace the latter by generating a magnetic field. The adjustable positioning can thereby take place very precisely. For example, it can be performed in a contact-free fashion. It is effected substantially without any delay by the generation of the magnetic field.

In another aspect, the disclosure provides an optical unit for a projection exposure apparatus. The optical unit includes at least one optical component and a device according to the disclosure for the adjustable positioning of the optical component. The advantages correspond to those described above.

The optical unit is, for example, an illumination optical unit for illuminating an object field or a projection optical unit for imaging the object field into an image field.

In one aspect, the disclosure provides an illumination system for a projection exposure apparatus. The illumination system includes a radiation source and an illumination optical unit according to the disclosure. The advantages correspond to those described above.

In a further aspect, the disclosure provides a projection exposure apparatus, which includes an optical unit as disclosed herein. The advantages correspond to those described above.

In another aspect, the disclosure provides a method for producing a microstructured component and a component produced in by such a method. The method includes providing a reticle, and providing a wafer having a light-sensitive coating. The method also includes projecting at least one section of the reticle onto the wafer with the aid of the projection exposure apparatus according to the disclosure. The method further includes developing the exposed light-sensitive coating on the wafer. A component produced according to the method according to the disclosure. For the advantages, reference should be made to those described above.

BRIEF DESCRIPTION OF THE DRAWINGS

Further advantages and details of the disclosure are evident from the description of exemplary embodiments with reference to the drawings, in which.

DESCRIPTION OF THE PREFERRED EMBODIMENTS

Figure 1:
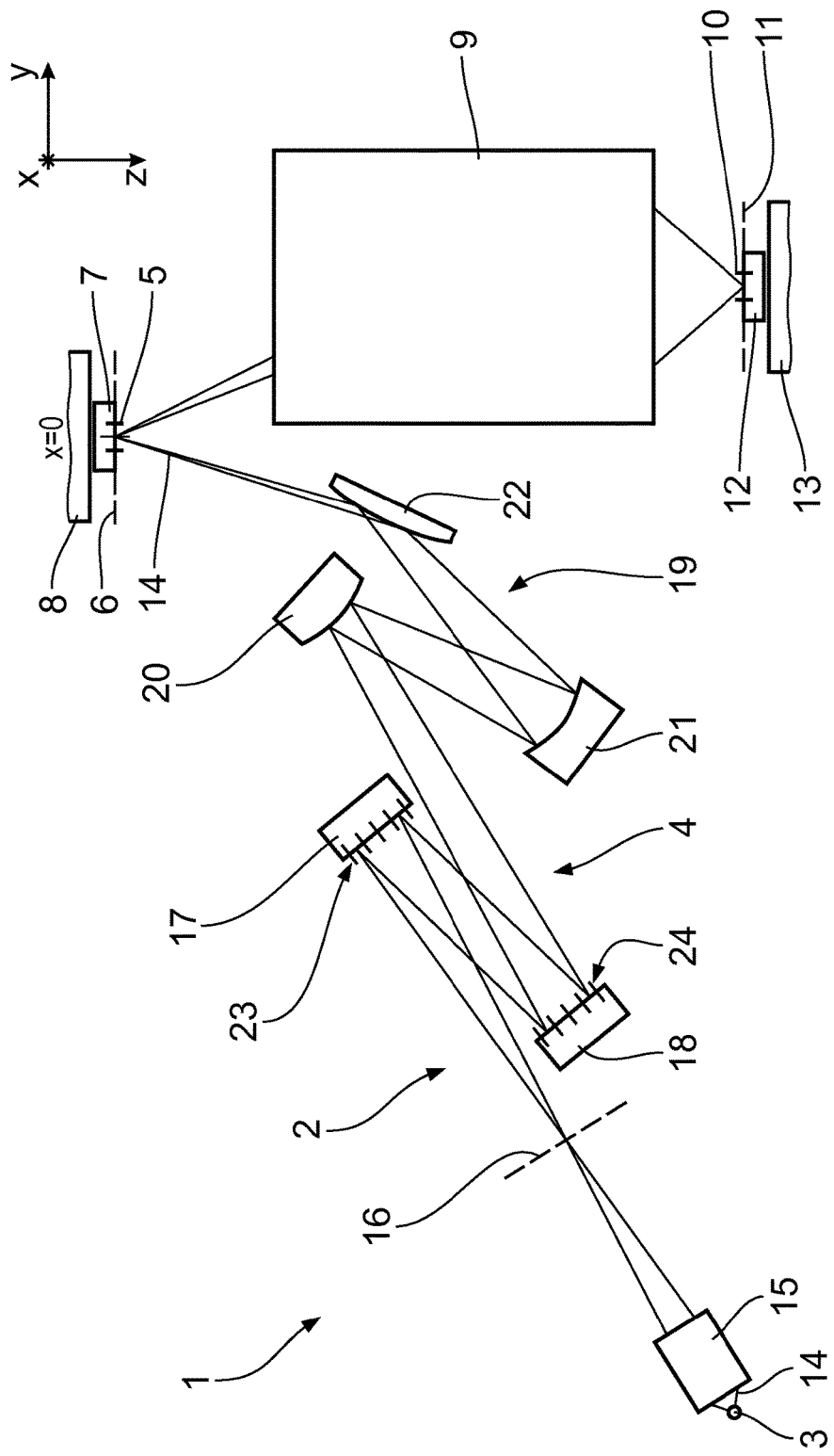
FIG. 1 schematically shows a meridional section through a projection exposure apparatus for EUV projection lithography.

FIG. 1 schematically shows a projection exposure apparatus 1 for microlithography in a meridional section. An illumination system 2 of the projection exposure apparatus 1 has, alongside a radiation source 3, an illumination optical unit 4 for exposing an object field 5 in an object plane 6. In this case, a reticle 7 arranged in the object field 5 is exposed, the reticle being held by a reticle holder 8 (only partially illustrated). A projection optical unit 9 serves for imaging the object field 5 into an image field 10 in an image plane 11. A structure on the reticle 7 is imaged onto a light-sensitive layer of a wafer 12 arranged in the region of the image field 10 in the image plane 11, the wafer being held by a wafer holder 13 (likewise illustrated schematically).

The radiation source 3 is an EUV radiation source having an emitted used radiation in the range of between 5 nm and 30 nm. The radiation source 3 can also be a radiation source having an emitted used radiation in a different wavelength range. However, the high-precision positioning according to the disclosure of an optical component is advantageous in particular for use in an EUV projection exposure apparatus. In this case, a plasma source can be involved, for example a GDPP (gas discharge-produced plasma) source or an LPP (laser-produced plasma) source. A radiation source based on a synchrotron can also be used for the radiation source 3. Information concerning such a radiation source can be found by the person skilled in the art for example from U.S. Pat. No. 6,859,515 B2. EUV radiation 14 emerging from the radiation source 3 is concentrated by a collector 15. Downstream of the collector 15, the EUV radiation 14 propagates through an intermediate focal plane 16 before it impinges on a field facet mirror 17 having a multiplicity of field facets 23. The field facet mirror 17 is arranged in a plane of the illumination optical unit 4 which is optically conjugate with respect to the object plane 6.

The EUV radiation 14 is also designated hereinafter as illumination light or as imaging light.

Downstream of the field facet mirror 17, the EUV radiation 14 is reflected by a pupil facet mirror 18 having a multiplicity of pupil facets 24. The pupil facet mirror 18 is arranged in a pupil plane of the illumination optical unit 4 which is optically conjugate with respect to a pupil plane of the projection optical unit 9. With the aid of the pupil facet mirror 18 and an imaging optical assembly in the form of a transfer optical unit 19 having mirrors 20, 21 and 22 designated in the order of the beam path, field facets of the field facet mirror 17 are imaged into the object field 5. The last mirror 22 of the transfer optical unit 19 is a mirror for grazing incidence ("grazing incidence mirror"). The pupil facet mirror 18 and the transfer optical unit 19 form a sequential optical unit for transferring the illumination light 14 into the object field 5. The transfer optical unit 19 can be dispensed with, for example, when the pupil facet mirror 18 is arranged in an entrance pupil of the projection optical unit 9.

For simpler description of positional relationships, a Cartesian xyz coordinate system is depicted in FIG. 1. In FIG. 1, the x-axis runs perpendicularly to the plane of the drawing into the latter. The y-axis runs towards the right. The z-axis runs downward. The object plane 6 and the image plane 11 both run parallel to the xy plane.

The reticle holder 8 is displaceable in a controlled manner such that during the projection exposure the reticle 7 can be displaced in a displacement direction in the object plane 6 parallel to the y-direction. Correspondingly, the wafer holder 13 is displaceable in a controlled manner such that the wafer 12 is displaceable in a displacement direction in the image plane 11 parallel to the y-direction. As a result, the reticle 7 and the wafer 12 can be scanned firstly by the object field 5 and secondly by the image field 10. The displacement direction is also designated hereinafter as the scanning direction. The displacement of the reticle 7 and of the wafer 12 in the scanning direction can preferably be effected synchronously relative to one another.

The projection optical unit 9 includes at least one optical component for imaging the object field 5 into the image field 10. The optical component is, for example, a mirror. The latter preferably bears a multilayer coating for optimizing the reflectivity of the wavelength of the used radiation 14.

The projection optical unit 9 includes, for example, at least four mirrors, such as five, six, seven, eight or more mirrors. In this case, one or a plurality of the mirrors can have a through-opening for the used radiation 14. For example, the mirror, which is arranged closest to the image field 10 and which forms the penultimate mirror in the beam path of the projection optical unit 9, can have a through-opening for the used radiation 14.

Further aspects of a device 26 for the adjustable positioning of an optical component 25, such as a mirror 30, are described below with reference to FIG. 2.

The device 26 for the adjustable positioning of the optical component 25 includes a holding unit 27 for mounting the optical component 25. The holding unit 27 includes a carrier, such as a baseplate 28, and six holding struts 29. The baseplate 28 is composed of a non-magnetic material. It can be composed, for example, of a glass ceramic. It is preferably composed of a material having a low coefficient of thermal expansion. The coefficient of thermal expansion of the material of the baseplate 28 is preferably less than 10-6/K.

The holding struts 29 are arranged on the baseplate 28 and mechanically connected thereto. They are arranged respectively in pairs. Two associated holding struts 29 are in each case also designated as a bipod. The six holding struts 29 together form a so-called hexapod. The three bipods of the hexapod are arranged in an equilateral triangle on the baseplate 28.

An alternative number and/or arrangement of the holding struts 29 on the baseplate 28 are/is likewise possible. Generally, the holding unit 27 includes at least one holding strut 29.

Figure 2:
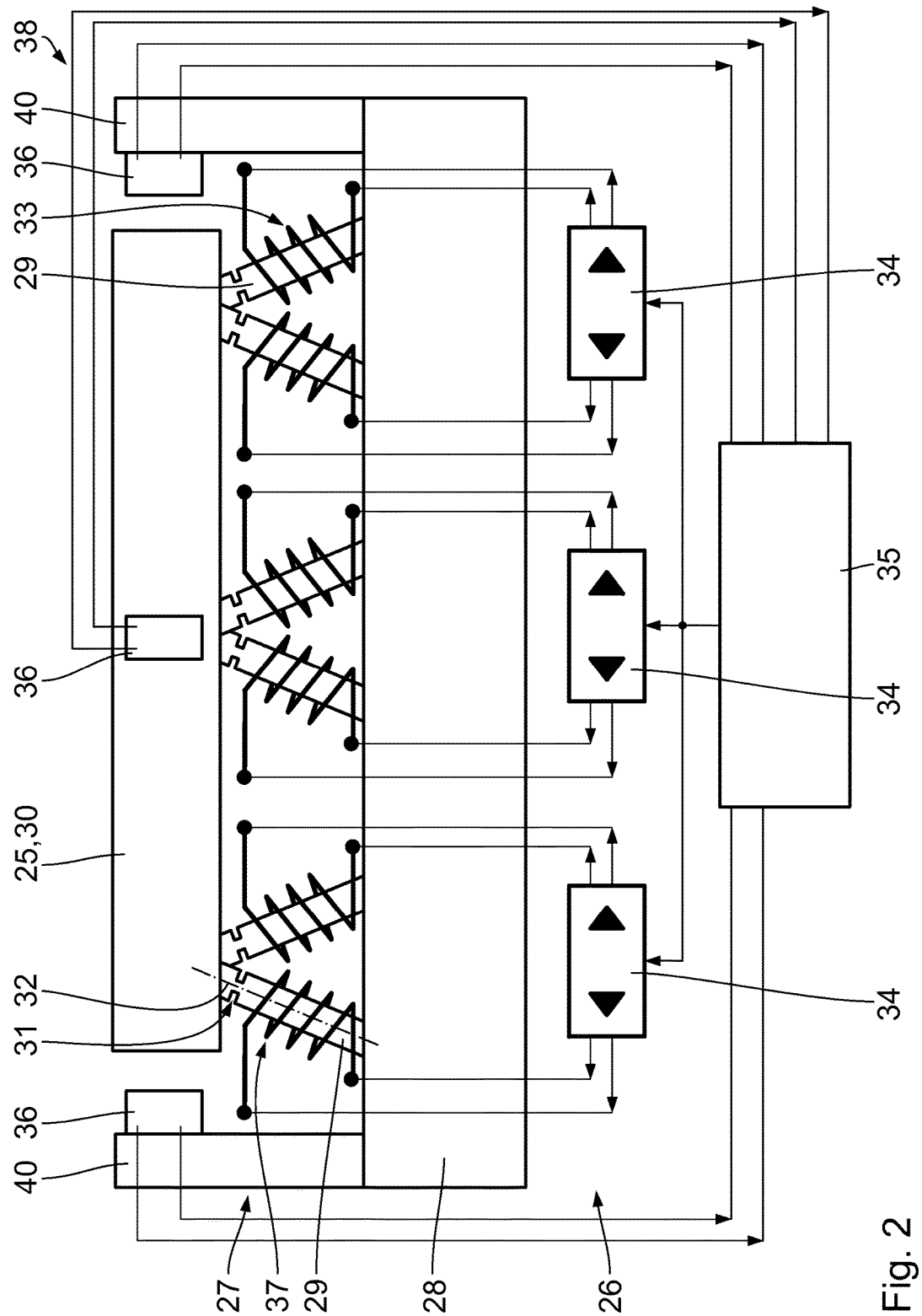
FIG. 2 shows a schematic illustration of an optical component with a device according to the disclosure for the adjustable positioning thereof.

The holding struts 29 extend in each case in a longitudinal direction 32, which is depicted only for one of the holding struts 29 in FIG. 2. They have, for example, an extent in the range of 1 cm to 100 cm, such as in the range of 2 cm to 60 cm, in the longitudinal direction 32. Perpendicularly to the longitudinal direction 32, the holding struts 29 have for example a round (e.g., circular) cross section or polygonal (e.g., square or hexagonal) cross section. Alternative embodiments of the holding struts 29 are likewise possible.

The holding struts 29 are connected to the mirror 30 in each case at their opposite end relative to the baseplate 28.

The holding struts 29 have, in particular in the region of their end facing the mirror 30, a flexure in the form of a circumferentially extending, bead-shaped constriction 31.

The constriction 31 facilitates bending of the holding strut 29 in a direction transversely with respect to the longitudinal direction 32 thereof.

The constriction 31 forms a decoupling element for mechanically decoupling the mirror 30 from the holding struts 29. Via the decoupling element, the mirror 30 is decoupled from the holding struts 29 in particular in at least one direction.

Instead of a circumferentially extending constriction, the holding strut 29 can also have a constriction 31 which reduces the cross section of the holding strut 29 in a first direction, while it leaves the cross section substantially unchanged in a second direction perpendicular to the first direction. This is also designated hereinafter as a one-dimensional or linear constriction, since it facilitates bending of the holding strut 29 exclusively in one direction, namely in the direction of the reduced cross section.

Preferably, in the case of a linear constriction 31, two constrictions 31 of this type are provided per holding strut 29, which are arranged in a manner rotated relative to one another. The two constrictions 31 are preferably arranged perpendicularly to one another and thus form a type of Cardan joint.

The holding struts 29 are composed of a magnetostrictive material, for example Invar, nickel or a samarium-iron compound. The material of the holding struts 29 preferably has a low coefficient of thermal expansion. The coefficient of linear thermal expansion of the material of the holding struts is, for example, at most 10-4/K, such as at most 3·10-5/K (e.g., at most 10-5/K, at most 5·10 6/K, at most 3·10-6/K). The holding struts 29 have an expansion which can be varied via a magnetic field. For example, the thermal expansion of the holding struts 29 can be compensated for by applying a magnetic field. Coils 33 are provided for generating the magnetic field for changing the length of the holding struts 29. The coils 33 form, in particular, a mechanism for generating a magnetic field in the region of the holding unit 27. They are part of the device 26. The maximum field strength of the magnetic field that can be generated via the coils 33 in the region of the holding struts 29 is in the range of approximately 100 mT to approximately 1 T. It is dependent on, among other things, the number of turns of the coils 33 and the current and can be flexibly adapted to the respective desire properties.

The holding struts 29 together with the coils 33 form in each case actuators 37 for positioning the mirror 30. For example, the length of the holding struts 29 in the longitudinal direction 32 can be varied via a suitable magnetic field. The maximum change in length that can be achieved via the magnetic field is in the range of from at least 10 nm to 10 μm. The relative change is up to 10-4. In particular, a tilting of the mirror 30 is possible with the aid of the three bipods. In this case, a tilting axis is respectively defined by the connecting line of two bipods. Tiltings of up to 10 mrad are possible with the aid of the device according to the disclosure. It is possible, for example, with the aid of the device 26 according to the disclosure to set the titling angle of the mirror 30 with respect to each of the three axes with an accuracy of at least 0.1 mrad.

The coils 33 each have at least one turn which is arranged around one of the holding struts 29. Preferably, one of the coils 33 is arranged around each of the holding struts 29. The number of coils 33 thus corresponds precisely to the number of holding struts 29. The coils 33 are arranged, in particular, so that the magnetic field that can be generated by them, in the region of the associated holding strut 29, is oriented in each case parallel to the longitudinal direction 32 thereof.

The coils 33 are mechanically decoupled from the mirror 30. They are arranged, for example, in a contact-free manner with respect to the mirror 30. They can furthermore be arranged in a contact-free manner with respect to the holding struts 29.

The coils 33 are preferably controllable independently of one another. In accordance with the embodiment illustrated in FIG. 2, the two coils 33 arranged around the holding struts 29 of a bipod are electrically connected to a common amplifier 34 in each case. For driving the six coils 33 of the three bipods of the holding units 27, the device thus includes three amplifiers 34. For their part, the amplifiers 34 are connected to a common control unit 35 in a signal-transmitting manner. Via the control unit 35, the electric current fed to the coils 33 via the amplifiers 34 is controllable so that the magnetic field that can be generated via the coils 33 in the region of the holding unit 27, for example in the region of the holding struts 29, has a predetermined directional and amplitude distribution. What is thereby achieved is that the mirror 30 is displaceable by a specific absolute value with the aid of the device 26. For the precise positioning and/or displacement of the mirror 30, the coils 33 are used to generate a magnetic field having a predefined directional and amplitude distribution in the region of the holding unit 27, for example, in the region of the holding struts 29. This leads, on account of the magnetostrictive material of the holding struts 29, to a predetermined change in length of the holding struts 29 and thus to an adjustable positioning of the mirror 30.

In one particularly advantageous embodiment, each of the bipods is additionally assigned a sensor 36. The exact position of the mirror 30 in the region of the associated bipod can be detected via the sensor 36. For example, the position of the mirror 30 in the plane spanned by the holding struts 29 of the bipod associated with the respective sensor 36 can be detected via the sensor 36.

The sensor 36 can be, for example, an optical, a capacitive or a Hall sensor. The sensor 36 can be a contactless sensor. The sensor 36 is connected to the control unit 35 in each case in a data-transmitting manner.

The control unit 35 can therefore be embodied together with the actuators 37 and the sensors 36 as a regulating unit. In this case, it can have a plurality of closed loops. It preferably has a separate closed loop for each bipod.

Figure 3:
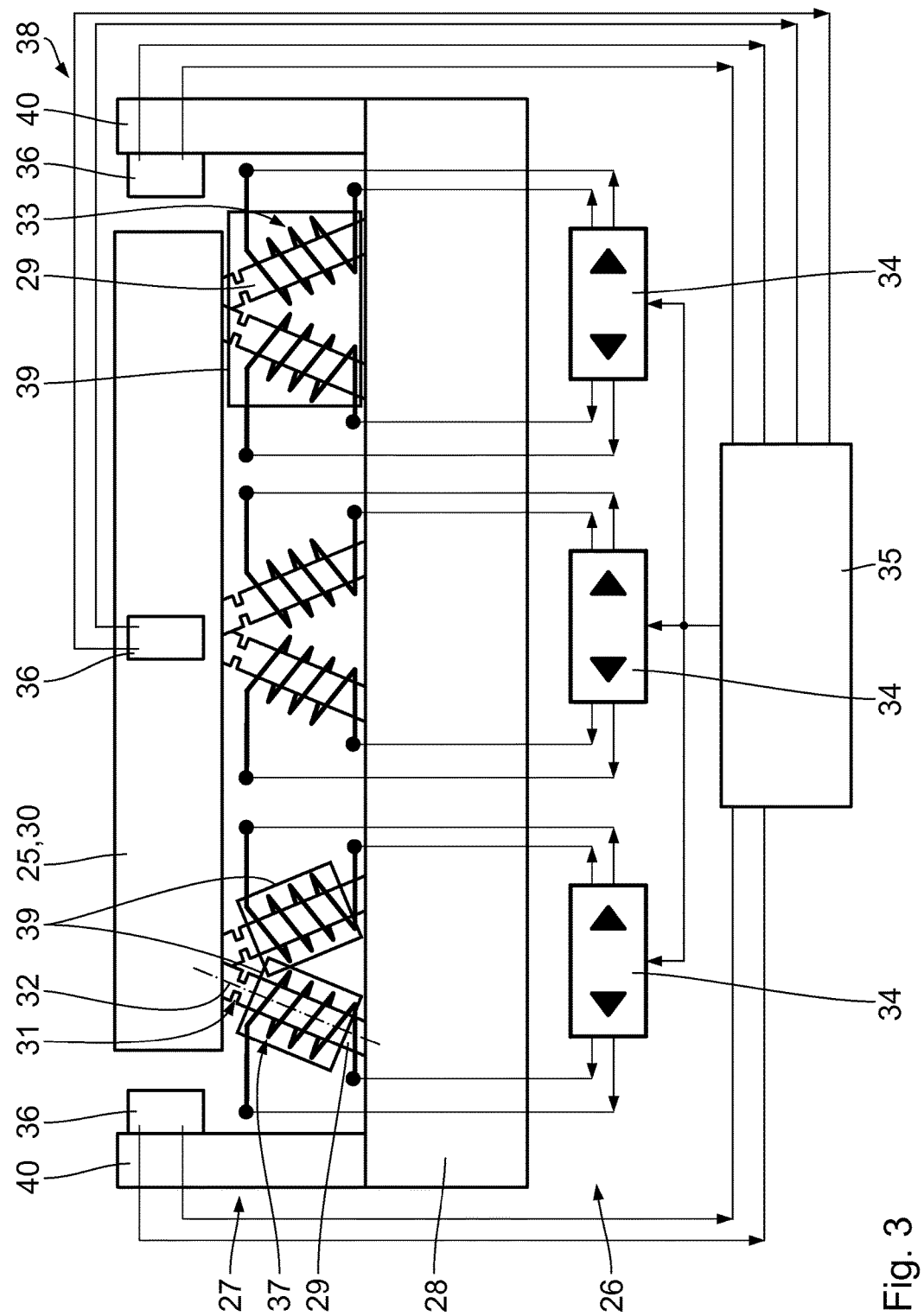
FIG. 3 shows a schematic illustration of an optical component with a further embodiment of a device according to the disclosure for the adjustable positioning thereof.

A development of the device 26 as illustrated schematically in FIG. 3 provides for surrounding the coils 33 with a shielding unit 39. The shielding unit 39 serves for the shielding or the magnetic field guidance of the magnetic field generated by the coils 33. In addition, the shielding unit 39 leads to a shielding of external magnetic fields and thus reduces the effect thereof on the holding struts 29. It is preferably composed of a soft-magnetic material, for example a nickel-iron alloy. The material of the shielding unit 39 has, for example, a relative permeability of at least 10,000, such as at least 30,000 (e.g., at least 50,000). The shielding unit is preferably embodied in a hollow-cylindrical fashion. It can surround respectively one of the coils 33, as illustrated by way of example in the left-hand half of FIG. 3. As an alternative thereto, it can be arranged around both holding struts 29 of a bipod with the associated coils 33, as is illustrated by way of example in the right-hand half of FIG. 3. The shielding unit 39 is preferably embodied such that it is closed circumferentially, i.e. in a direction transversely with respect to the longitudinal direction 32. It is mechanically connected, for example adhesively bonded or welded, to the baseplate 28.

The shielding unit 39 is arranged in a contact-free fashion with respect to the holding struts 29 and/or the optical component 25.

The optical component 25 together with the positioning device 26 forms an optical assembly 38. The latter can be part of the illumination optical unit 4 or of the projection optical unit 9 of the projection exposure apparatus 1. It is also possible for a plurality of the mirrors of the illumination optical unit 4 and/or of the projection optical unit 9 to be provided with a corresponding device 26. In principle, it is conceivable to provide all mirrors of the illumination optical unit 4 and/or of the projection optical unit 9 with the positioning device 26 according to the disclosure.

In principle, it is possible to provide the entire optical assembly 38 with a magnetic shielding corresponding to the shielding unit 39. The magnetic shielding of the optical assembly 38 can be integrated, for example, into the baseplate 38 and/or into a side wall 40 projecting from the latter in the direction of the optical component 25. For details of the shielding, reference should be made to the description of the shielding unit 39.

During the use of the projection exposure apparatus 1 with one of the collector variants described above, the reticle 7 and the wafer 12 are provided, the wafer bearing a coating that is light-sensitive to the illumination light 14. Subsequently, at least one section of the reticle 7 is projected onto the wafer 12 with the aid of the projection exposure apparatus 1. During the projection of the reticle 7 onto the wafer 12, the reticle holder 8 and/or the wafer holder 13 can be displaced in a direction parallel to the object plane 6 and/or parallel to the image plane 11, respectively. The reticle 7 and the wafer 12 can preferably be displaced synchronously with respect to one another. Finally, the light-sensitive layer exposed by the illumination light 14 on the wafer 12 is developed. A micro- or nanostructured component, for example a semiconductor chip, is produced in this way.

What is claimed is:

1. A device, comprising:
   a holding unit configured to mount an optical component, the holding unit comprising a holding strut comprising a magnetostrictive material;
   a carrier, the holding strut being arranged on the carrier, and a first end of the holding strut being mechanically connected to the carrier; and
   a mechanism configured to generate a magnetic field having a directional and amplitude distribution in a region of the holding unit,
   wherein:
   the holding strut is configured to be connected to the optical component at a second end of the holding strut;
   the holding strut has a stiffness of at least $10^4$ N/mm;
   the second end of the holding strut is opposite the first end of the holding strut;
   a longitudinal length of the holding strut varies based on an absolute value of the magnetic field;
   the holding strut is mechanically decoupled from the optical component via a decoupling element;
   a tilting angle of the optical component is settable with an accuracy of at least 0.1 mrad; and
   the decoupling element comprises at least one element selected from the group consisting of a circumferential constriction in the holding strut and a cut-out in the holding strut.

2. The device of claim 1, wherein the mechanism configured to generate the magnetic field comprises a coil.

3. The device of claim 2, wherein the coil comprises a turn arranged around the holding strut.

4. The device of claim 1, wherein the mechanism configured to generate the magnetic field is arranged so that at least sections of the magnetic field are parallel to the holding strut.

5. The device of claim 1, comprising a plurality of holding struts arranged in pairs.

6. The device of claim 5, wherein each pair of holding structures is configured as a bipod.

7. The device of claim 6, wherein each holding strut:
comprises a magnetostrictive material;
is arranged on the carrier;
has a first end mechanically connected to the carrier;
is configured to be connected to the optical component at a second end which is opposite its first end; and
has a longitudinal length which varies based on an absolute value of the magnetic field.

8. The device of claim 5, wherein each holding strut:
comprises a magnetostrictive material;
is arranged on the carrier;
has a first end mechanically connected to the carrier;
is configured to be connected to the optical component at a second end which is opposite its first end; and
has a longitudinal length which varies based on an absolute value of the magnetic field.

9. An apparatus, comprising:
an illumination optical unit; and
a projection optical unit,
wherein at least one unit selected from the group consisting of the illumination optical unit and the projection optical unit comprises the device of claim 1.

10. A method, comprising
providing an optical component and a device according to claim 1; and
generating the magnetic field to adjustably position the optical component.

11. A method of operating a microlithography projection exposure apparatus comprising an illumination optical unit and a projection optical unit, the method comprising:
using the projection optical unit to project a section of a reticle onto a light-sensitive material,
wherein at least one unit selected from the group consisting of the illumination optical unit and the projection optical unit comprises the device of claim 1.

12. The method of claim 11, further comprising using the illumination optical unit to illuminate the section of the reticle.

13. The method of claim 11, wherein EUV radiation is used to project the section of the reticle onto the light-sensitive material.

14. The device of claim 1, wherein the holding strut comprises invar.

15. The device of claim 1, wherein the holding strut comprises nickel.

16. The device of claim 1, wherein the carrier has a coefficient of thermal expansion of less than $10^{-6}$/K.

17. An optical unit, comprising:
an optical component; and
a device, comprising:
a holding unit configured to mount the optical component, the holding unit comprising a holding strut comprising a magnetostrictive material;
a carrier, the holding strut being arranged on the carrier, and a first end of the holding strut being mechanically connected to the carrier; and
a mechanism configured to generate a magnetic field having a directional and amplitude distribution in a region of the holding unit,
wherein:
the holding strut is connected to the optical component at a second end of the holding strut;
the holding strut has a stiffness of at least $10^4$ N/mm;
the second end of the holding strut is opposite the first end of the holding strut;
a longitudinal length of the holding strut varies based on an absolute value of the magnetic field;
the holding strut is mechanically decoupled from the optical component via a decoupling element;
a tilting angle of the optical component is settable with an accuracy of at least 0.1 mrad; and
the decoupling element comprises at least one element selected from the group consisting of a circumferential constriction in the holding strut and a cut-out in the holding strut.

18. The optical assembly of claim 17, wherein the optical unit is a microlithography illumination optical unit.

19. The optical assembly of claim 17, wherein the optical unit is a microlithography projection optical unit.

20. A system, comprising:
an optical unit according to claim 17, the optical unit being an illumination optical unit; and
a radiation source,
wherein the system is a microlithography illumination system.

21. The optical unit of claim 17, wherein the carrier has a coefficient of thermal expansion of less than $10^{-6}$/K.

* * * * *